(12) United States Patent
Lo et al.

(10) Patent No.: US 11,351,509 B2
(45) Date of Patent: Jun. 7, 2022

(54) FILTER WITH SEAL TREATMENT

(71) Applicant: Taiwan Semiconductor Manufacturing Company, Ltd., Hsin-Chu (TW)

(72) Inventors: Kuan-Hsin Lo, Caotun Township (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1208 days.

(21) Appl. No.: 14/338,883

(22) Filed: Jul. 23, 2014

(65) Prior Publication Data
US 2015/0157987 A1    Jun. 11, 2015

Related U.S. Application Data (60) Provisional application No. 61/913,000, filed on Dec. 6, 2013.

(51) Int. Cl.
*B01D 67/00* (2006.01)
*B01D 65/00* (2006.01)
(Continued)

(52) U.S. Cl.
CPC ....... *B01D 67/0093* (2013.01); *B01D 65/003* (2013.01); *B01D 69/02* (2013.01);
(Continued)

(58) Field of Classification Search
None
See application file for complete search history.

(56) References Cited

U.S. PATENT DOCUMENTS 3,061,431 A * 10/1962 Levinos ............... C08F 2/46
430/281.1
4,695,592 A * 9/1987 Itoh ................. B01D 67/0088
210/490
(Continued)

FOREIGN PATENT DOCUMENTS

CN 1254299 A 5/2000
KR 20010012136 A 2/2001
(Continued)

OTHER PUBLICATIONS

Environmental Protection Agency, N, N'-Methylenebisacrylamide, (n.d.), available at https://comptox.epa.gov/dashboard/dsstoxdb/results?search=ZIUHHBKFKCYYJD.*
(Continued)

*Primary Examiner* — Magali p Slawski
*Assistant Examiner* — Brad Gordon
(74) *Attorney, Agent, or Firm* — Slater Matsil, LLP (57) ABSTRACT

In accordance with an embodiment, a filter membrane is sealed with a sealing material prior to using the filter membrane to filter process fluids. The sealing material is a fluorine-based polymer or a polymer with a cross-linking group. Once the sealing material has been placed in contact with the filter membrane, a cross-linking reaction may be initiated using either physical or chemical processes to cross-link the sealing material and to seal the filter membrane within the sealing material, thereby separating the filter membrane from the process fluids, reducing or eliminating leaching of the filter membrane into the process fluid.

20 Claims, 6 Drawing Sheets

(51) Int. Cl.
*B01D 69/02* (2006.01)
*G03F 7/16* (2006.01)

(52) U.S. Cl.
CPC ............ *G03F 7/16* (2013.01); *B01D 2313/04* (2013.01); *B01D 2323/30* (2013.01); *B01D 2323/34* (2013.01)

(56) References Cited

U.S. PATENT DOCUMENTS

| | | | |
|---|---|---|---|
| 5,096,473 A | 3/1992 | Sassa et al. | |
| 5,976,380 A | 11/1999 | Moya | |
| 6,299,723 B1* | 10/2001 | Seto | B01D 19/0031 |
| | | | 134/110 |
| 8,152,889 B2 | 4/2012 | Choi | |
| 8,282,713 B2 | 10/2012 | Smithies et al. | |
| 2004/0094463 A1* | 5/2004 | Laverdiere | B01D 19/0031 |
| | | | 210/188 |
| 2004/0195172 A1* | 10/2004 | Yeh | B01D 67/0088 |
| | | | 210/490 |
| 2007/0037089 A1* | 2/2007 | Chang | G03F 7/091 |
| | | | 430/270.1 |
| 2007/0099429 A1* | 5/2007 | Brandl | G03F 7/38 |
| | | | 438/715 |
| 2007/0119774 A1* | 5/2007 | Yen | B01D 19/0031 |
| | | | 210/500.1 |
| 2007/0207406 A1 | 9/2007 | Guerrero et al. | |
| 2009/0188857 A1* | 7/2009 | Moore | B01D 53/228 |
| | | | 210/500.34 |
| 2009/0286178 A1* | 11/2009 | Muroi | B01D 61/14 |
| | | | 430/270.1 |
| 2009/0311624 A1 | 12/2009 | Horiguchi et al. | |
| 2010/0040971 A1 | 2/2010 | Tarutani et al. | |
| 2010/0230351 A1* | 9/2010 | Hoving | B01D 69/02 |
| | | | 210/650 |
| 2012/0034558 A1* | 2/2012 | Chang | G03F 7/0046 |
| | | | 430/270.1 |
| 2012/0118816 A1* | 5/2012 | Gjoka | B01D 65/10 |
| | | | 210/506 |
| 2012/0165420 A1* | 6/2012 | Bhikhi | B01D 67/0006 |
| | | | 521/27 |
| 2013/0109262 A1 | 5/2013 | Zhou | |

FOREIGN PATENT DOCUMENTS

| | | | |
|---|---|---|---|
| KR | 20130080451 A | 7/2013 | |
| WO | WO 2012128939 A2 * | 9/2012 | ............ B01D 71/34 |

OTHER PUBLICATIONS

KJ Chemical Corporation, DMAA™ (N,N-Dimethyl Acrylamide), (n.d.), available at https://www.kjchemicals.co.jp/en/product/function01.html.*

Umeda et al., Solvent pre-wetting as an effective start-up method for point-of-use filter, 8325 PROC SPIE (2012). (Year: 2012).*

Lau et al., "New Thermal Cross-Linkers Based on Triazene: Cross-Linking of Fluorinated Polyimides and Aromatic Polymers," Macromolecules, Jun. 17, 1992, 25, pp. 7294-7299.

* cited by examiner

FILTER WITH SEAL TREATMENT

PRIORITY CLAIM AND CROSS-REFERENCE

This application claims priority to U.S. Provisional Application No. 61/913,000, filed on Dec. 6, 2013, and entitled "Filters and Methods of Using Same," which application is incorporated herein by reference.

BACKGROUND

In a semiconductor manufacturing process, semiconductor chips may be manufactured having devices such as transistors, resistors, capacitors, inductors, and the like formed therein. The manufacture of semiconductor chips may involve many processing steps, which may include combinations of photolithography, ion implantation, doping, annealing, packaging, etc. Many types of fluids may be used in these processes including water, dielectrics, polymers, photoresists, chemical etchants, acids, etc. These fluids are filtered and passed to manufacturing equipment, which uses the fluids during the manufacture of semiconductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
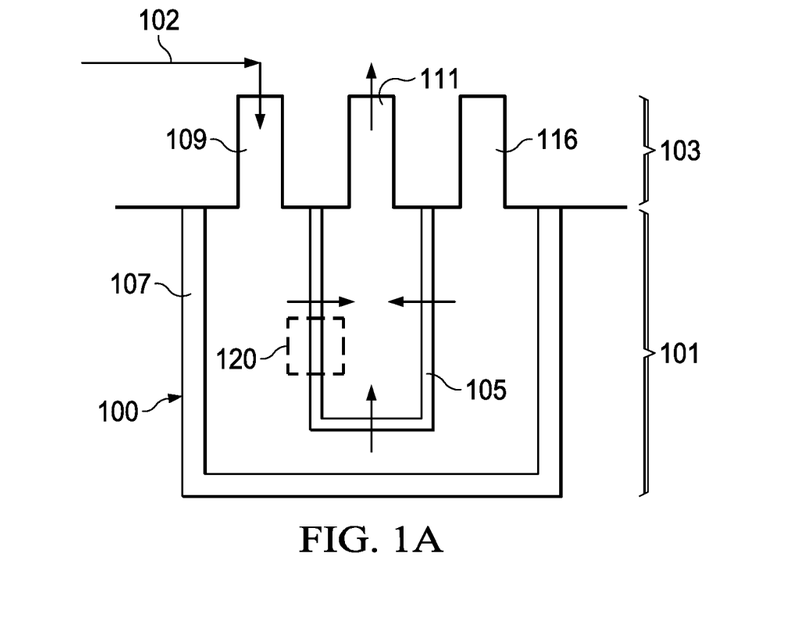
FIGS. 1A-1B illustrate a filter with a filter membrane in accordance with some embodiments.

Referring now to FIG. 1A, a filter 100 is illustrated. In an embodiment the filter 100 may include a filter basin 101, a filter cap 103, and a filter membrane 105. The filter basin 101 may be any desired shape that may be suitable for contacting a process liquid 102 (e.g., a negative tone developer) with the filter membrane 105. In the embodiment illustrated in FIG. 1A, the filter basin 101 has a cylindrical sidewall and a bottom. However, the filter basin 101 is not limited to a cylindrical shape, and any other suitable shape, such as a hollow square tube, an octagonal shape, or the like, may alternatively be utilized. Furthermore, the filter basin 101 may be surrounded by a housing 107 made of material that is inert to the various process materials. As such, while the housing 107 may be any suitable material that can withstand the chemistries and pressures involved in the process, in an embodiment the housing 107 may be steel, stainless steel, nickel, aluminum, alloys of these, combinations of these, and like.

The filter basin 101 may also have a filter cap 103 to enclose the filter basin 101. The filter cap 103 may be attached to the housing 107 utilizing, e.g., a seal such as an o-ring, a gasket, or other sealant in order to prevent leakage from the filter basin 101 while at the same time allowing the filter cap 103 to be removed for access to the filter basin 101 within the interior of the housing 107. Alternatively, the filter cap 103 may be attached by welding, bonding, or adhering the filter cap 103 to the housing 107 in order to form an air-tight seal and prevent any leakage.

An inlet port 109 and an outlet port 111 may provide access to the filter basin 101 in order to receive the process liquid 102 (e.g., a negative tone developer) and output a filtered process liquid 102, respectively. The inlet port 109 and the outlet port 111 may be formed in the filter cap 103 of the filter basin 101 (as illustrated in FIG. 1A) or may alternatively be formed through the sidewalls of the filter basin 101. In an embodiment the inlet port 109 and the outlet port 111 may also include various valves and fittings (not shown for clarity) to facilitate removal and replacement of the filter basin 101.

The filter cap 103 may also include a first vent port 116. The first vent port 116 may be used to controllably vent process gases that may arise either during maintenance of the filter 100 or else during emergency conditions in order to controllably relieve pressure that may build up in the filter 100. The first vent port 116 may also include various valves and fittings (not shown for clarity) in order to facilitate installation or operation of the first vent port 116.

Figure 1B:
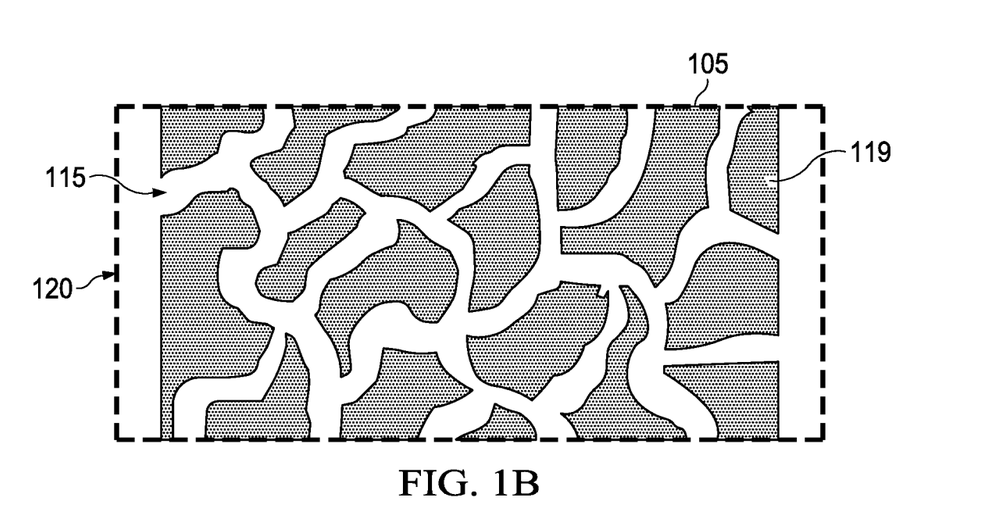

FIG. 1B illustrates a more detailed, close up view of a section of the filter membrane 105 (seen in FIG. 1A by the dashed line 120), which may be used to filter the process liquid 102 that passes into the filter basin 101 through the inlet port 109, through the filter membrane 105, and out of the filter basin 101 through the outlet port 111. In an embodiment the filter membrane 105 is located between the inlet port 109 and the outlet port 111 so that the process liquid 102 has to pass through the filter membrane 105 prior to leaving the filter basin 101.

FIG. 1B illustrates with a perspective view and in greater detail (although still not to scale) a portion of the filter membrane 105 surrounded by the dashed box 120 in FIG. 1A. As can be seen, the filter membrane 105 comprises a filter material 119 with a series of pores 115 that allow the process liquid 102 to flow through the filter membrane 105. The pores 115 act as the filtering mechanism and prevent particles and other impurities that have a larger size than the pores 115 from passing through the filter membrane 105. This removal of the impurities prevents the impurities from interfering with further processing once the process liquid 102 leaves the filter 100 for usage in the actual manufacturing of semiconductor devices.

As such, the size of the pores 115 is at least in part dependent upon the materials and processes into which the filter 100 will be placed. As particular examples, the size of the pores 115 is dependent at least is part on the size of the impurities that are desired to be removed while also taking into account other factors such as pressure drop that may be experienced through the filter 100, or the like. However, in an embodiment in which the process liquid 102 is a negative tone developer for a photoresist development process, the pores 115 may have a size of between about 1 nm and about 50 nm, such as about 10 nm.

The filter membrane 105 may be made of a filter material 119 that is chemically inert to the process liquid 102 being filtered so that the process liquid 102 being filtered is not significantly altered by a chemical reaction as it passes through the filter membrane 105. In an embodiment the filter material 119 may comprise a nonpolar polymer such as polyethylene (UPE), whose repeating chemical structure is illustrated below:

By using a nonpolar polymer such as UPE, the ability of the filter material 119 to remove a particular size of impurities may be physically controlled by the size of the pores 115.

However, while the filter material 119 may not significantly react with the process liquid 102, portions of the filter material 119 may still be leached into the process liquid 102. As only one example, in an embodiment in which the filter membrane 105 is UPE and the process liquid 102 is an organic solvent such as a negative tone developer, oligomers and other organic impurities from the filter membrane 105 may be leached into the process liquid 102 when the process liquid 102 can absorb the oligomers and other organic impurities. Such absorption can remove material from the filter membrane 105 and redeposit it further in the manufacturing line, such as by depositing it on a photoresist (not individually illustrated in FIG. 1A) that has been developed using the process liquid 102 (e.g., negative tone developer) from the filter 100.

Figure 2:
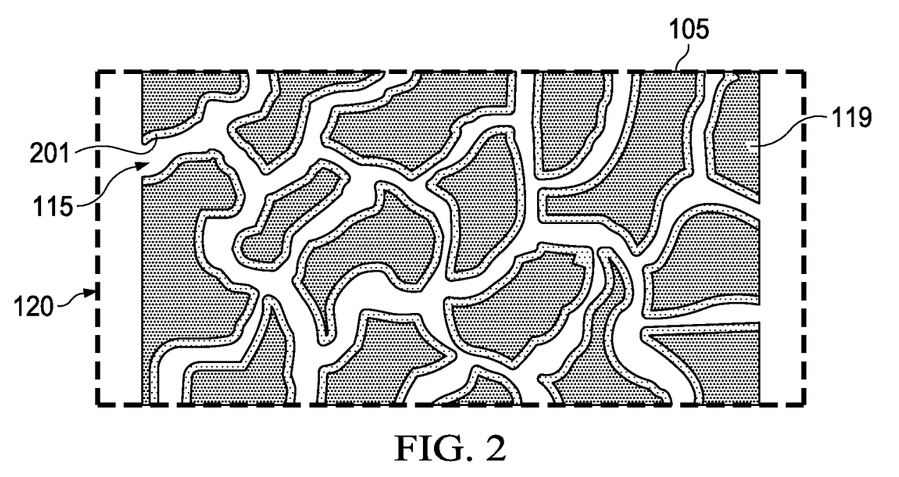
FIG. 2 illustrates a placement of a seal material in accordance with some embodiments.

FIG. 2 illustrates one embodiment in which leaching of materials from the filter membrane 105 may be reduced or eliminated. In an embodiment a seal 703 (not illustrated in FIG. 2 but illustrated and discussed below with respect to FIG. 7) may be used to seal and separate the filter material 119 (e.g., UPE) from a subsequently introduced process liquid 102. By placing the seal 703 on the filter material 119, the seal 703 can seal in the filter material 119 and act as a barrier to prevent leaching of the filter membrane 105 into the process liquid 102. As such, the seal 703 can reduce or eliminate material from the filter membrane 105 from being leached and redeposited further in the manufacturing process.

Additionally, while FIG. 2 illustrates an introduction of a seal material 201 to the filter membrane 105 as an initial step to form the seal 703, this is an illustrative embodiment and is not intended to be limiting to the embodiments. Rather, the seal material 201 may be introduced to all of the components of the filter that may or may not come into contact with the subsequently introduced process liquid 102. For example, the seal 703 may be used to seal the filter basin 101, the filter cap 103, the inlet port 109 and the outlet port 111, as well as any other components within the filter 100. All such components are fully intended to be included within the scope of the embodiments.

The seal 703 is placed by initially introducing the seal material 201 to the filter material 119 within the filter membrane 105. In particular, the seal material 201 is introduced in a liquid form so that the seal material 201 may coat on the surface of pores 115 of the filter membrane 105 and also penetrate into the filter material 119 (not separately illustrated in FIG. 2). Once the seal material 201 has coated on the surface of filter material 119, a treatment 701 (not illustrated in FIG. 2 but illustrated and discussed further below with respect to FIG. 7) may be utilized to form the seal 703 from the seal material 201.

In an embodiment the seal material 201 may be a polymer or a molecule that is capable of cross-linking with other polymers or molecules when the treatment 701 is applied. By using a cross-linking capable material such as a cross-linking agent and then treating it such that the polymer or molecule cross-links, the seal material 201 may be introduced to the filter material 119 within the filter membrane 105 and pores 115 then treated to form the seal 703. Additionally, in some embodiments the seal material 201 will include a fluorine containing group within the polymer or molecule and it will be mixed with the material of the filter membrane 119. After treatment (e.g., heating), the fluorine containing molecule will float to the surface of the filter membrane 105 and the surface of the filter membrane 105 will be covered with the seal material 201 such that the surface tension of the surface of the filter membrane 105 will be between about 30 dynes/cm and about 70 dynes/cm.

Figure 3:
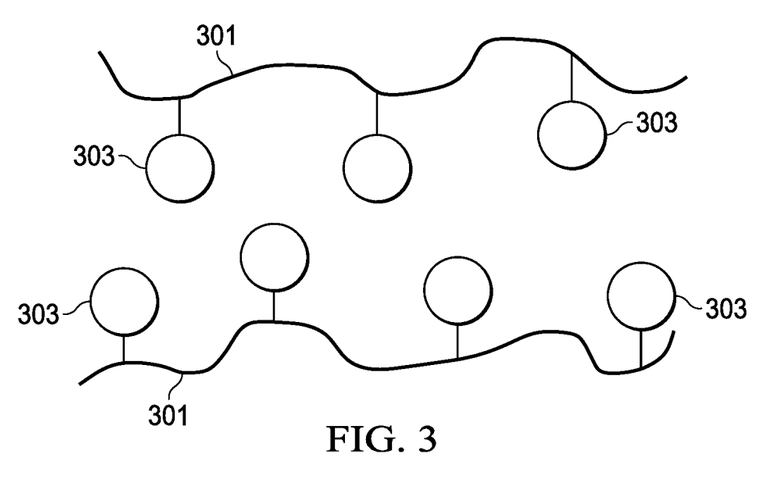
FIG. 3 illustrates an embodiment of a seal material that is a cross-linking polymer in accordance with some embodiments.

As one example, in an embodiment in which the seal material 201 comprises the fluorine group in a polymer, the seal material 201 may have one of the following structures:

FIG. 3 illustrates an embodiment in which the seal material 201, rather than being in a polymer or molecule comprising solely the structures described above, may be part of a molecule or polymer that comprises a hydrocarbon backbone 301 and cross-linking groups 303 bonded to the hydrocarbon backbone 301. In an embodiment the cross-linking functional group 303 comprises a hydroxyl group or an amine functional group that will react to bond with other cross-linking functional groups 303 on other ones of the cross-linking monomer or else bond directly with the other ones of the cross-linking polymers themselves in order to form the seal 703 for the filter membrane 105.

In particular embodiments, the cross-linking functional group 303 may have the following structures:

However, as one of ordinary skill in the art will recognize, the cross-linking monomers and cross-linking functional groups 303 described above are intended to be illustrative and are not intended to be limiting. Rather, any suitable cross-linking monomer or cross-linking functional group 303 may be utilized, and all such polymers and functional groups are fully intended to be included within the scope of the embodiments.

Figure 4:
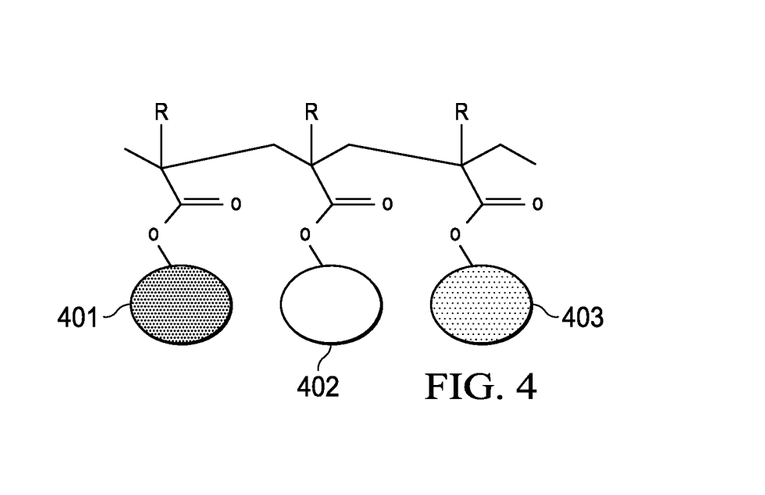
FIG. 4 illustrates an embodiment of a seal material that utilizes a photoresist polymer resin in accordance with some embodiments.

FIG. 4 illustrates another embodiment of the seal material 201 in which the cross-linking polymer is, e.g., a photoresist polymer resin, wherein R within FIG. 4 comprises a hydrogen, an acrylate, or a methacrylate to order to assist with etching selectivity. In an embodiment the photoresist polymer resin may comprise a hydrocarbon structure (such as an alicyclic hydrocarbon structure) that contains one or more protective groups (e.g., acid labile groups). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like. In FIG. 4 $R_9$ may be a methyl group, ethyl group or hydrogen.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

One of the repeating units within the photoresist polymer resin has a protective group 401. The protective group 401, otherwise known as a leaving group or an acid labile group, is attached to the hydrocarbon structure. In an embodiment the protective group 401 may be a carboxylic acid group, a fluorinated alcohol group, a phenolic alcohol group, a sulfonic group, a sulfonamide group, a sulfonylimido group, an (alkylsulfonyl)(alkylcarbonyl)methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl) imido group, a tris(alkylcarbonyl methylene group, a tris (alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

Another one of the repeating units within the photoresist polymer resin may have the cross-linking group 402 attached to the repeating unit. In an embodiment the cross-linking group 402 may be the cross-linking groups 303 as described above with respect to FIG. 3, and the cross-linking group may be attached to the hydrocarbon backbone of the photoresist polymer resin. However, any suitable cross-linking group may alternatively be utilized, and all such cross-linking groups are fully intended to be included within the scope of the embodiment.

Alternatively, the cross-linking monomers, such as the cross-linking monomers described above with respect to the fluorine containing groups, may be utilized within the photoresist polymer resin. In this embodiment the cross-linking monomers are added to the photoresist polymer resin as another monomer that makes up the hydrocarbon backbone. However, any suitable cross-linking monomer may alternatively be utilized.

Additionally the photoresist polymer resin may also comprise other groups attached to the hydrocarbon structure that help to improve a variety of properties of the polymerizable resin. For example, inclusion of a first lactone group 403 to the hydrocarbon structure in order to adjust the hydrophilicity of the photoresist polymer resin and to improve its solubility. In an embodiment the first lactone groups 403 may include rings having five to seven members, although any suitable lactone structure may alternatively be used for the first lactone group 403.

In an embodiment the protective group 401 may have a loading within the photoresist polymer resin of between about 20% and about 60%, such as about 45%. Also, the first lactone group 403 may have a loading within the photoresist polymer resin of between about 20% and about 60%, such as about 45%, and the monomer with the cross-linking group 303 may have a loading of between about 1% and about 20%, such as about 10%. However, these descriptions are intended to be illustrative as any suitable loading between the various monomers of the photoresist polymer resin may be used, and all such loadings are fully intended to be included within the scope of the embodiments.

In yet another embodiment the seal material 201 may be a floating cross-linking material. In this embodiment the seal material 201 has a lower surface tension than the filter material 119 and, as such, will "float" to the surface of the filter membrane 105 after being applied and prior to the treatment 701 being applied.

In an embodiment the floating cross-linking material may be similar to the previous embodiments such as by being the photoresist polymer resin. However, in this embodiment the cross-linking group 303 will be a floating cross-linking group, which will modify the surface tension of the photoresist polymer resin and cause it to "float" to the surface of the filter membrane 105. In an embodiment, the floating cross-linking group may comprise any of the cross-linking groups described above with respect to the cross-linking functional group 303, but with a fluorine atom bonded to the cross-linking functional group 303.

For example, the floating cross-linking group comprising a fluorine atom may have one of the following structures:

Where X is the cross-linking functional group 303 and $R_1$ is a bulky unit with C2~C30 alkyl group, a cycloalkyl group, a hydroxylalkyl group, an alkoxy group, an alkoxyl alkyl group, an acetyl group, an acetylalkyl group, a carboxyl group, an alky caboxyl group, a cycloalkyl carboxyl group, a C2~C30 saturated or unsaturated hydrocarbon ring or a C2-C30 heterocyclic group which can be chain, ring, or 3-D structure (adamantyl for example).

In an alternative embodiment the floating cross-linking group may be a floating cross-linking group that is free from a fluorine atom. For example, in some embodiments the floating cross-linking group may have one of the following structures:

By utilizing the photoresist polymer resin as described with respect to FIG. 4, the cross-linked treatment can help to improve the stability of the coating on the filter membrane 105. Additionally, this coating will not only help to shrink the size of the pores within the filter 100, but will also improve the filters 100 affinity to a photoresist solution, and will increase the adhesion between particles and gels and the filter membrane 105.

Figure 5:
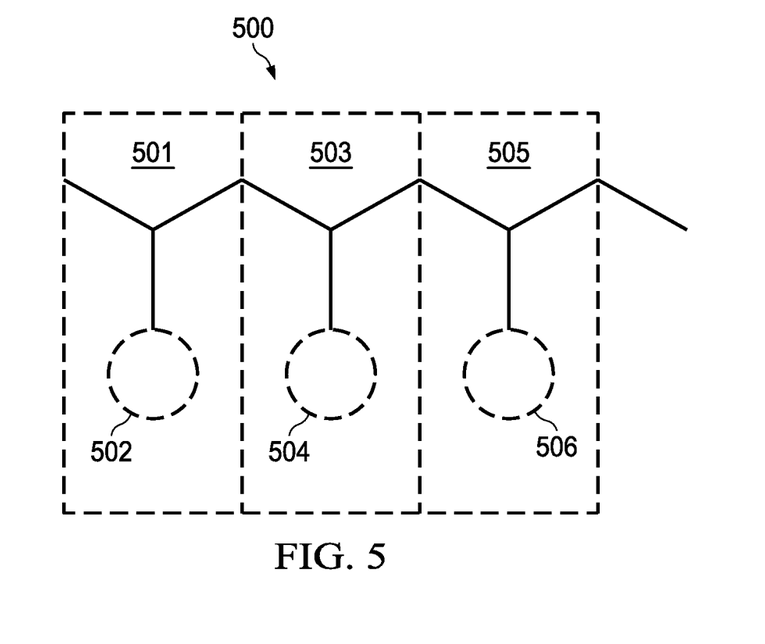
FIG. 5 illustrates an embodiment of a seal material that utilizes a bottom anti-reflective coating polymer resin in accordance with some embodiments.

FIG. 5 illustrates yet another embodiment in which the seal material 201 may comprise a polymer such as a photoresist (PR) polymer resin 500 that may be otherwise used (along with a catalyst and an external cross-linking agent). In an embodiment the PR polymer resin 500 comprises a number of repeating units, such as a surface energy modification monomer 501 (with a surface energy modification group 502), a lactone monomer 503 (with a second lactone group 504), and a cross-linking monomer 505 (with a cross-linking group 506). The surface energy modification monomer 501 is utilized to try and match the surface energy of the PR polymer resin 500 to the surface energy of the filter material 119. By matching the surface energies, the PR polymer resin 500 may better fill the gaps around the filter material 119.

In one embodiment the surface energy modification monomer 501 may be used to increase the surface energy of the PR polymer resin 500. In such an embodiment, to raise the surface energy of the PR polymer resin 500, the surface energy modification group 502 within the surface energy modification monomer 501 comprises one or more of a hydroxyl group, a carboxyl group, an amine group, or an amide group. The surface energy modification monomer 501 also might be the bulky unit with C2~C30 alkyl group, a cycloalkyl group, a hydroxylalkyl group, an alkoxy group, an alkoxyl alkyl group, an acetyl group, an acetylalkyl group, a carboxyl group, an alky caboxyl group, a cycloalkyl carboxyl group, a C2~C30 saturated or unsaturated hydrocarbon ring or a C2-C30 heterocyclic group which can be chain, ring, or 3-D structure (adamantyl for example).

In particular embodiments, the surface energy modification monomer 501 may comprise an acrylic acid monomer, a methacrylic acid monomer, a hydrostyrene monomer, or a monomer derived from 2-hydroxyethyl acrylate. For example, in an embodiment in which the surface energy modification group 502 is a hydrostyrene monomer, the surface energy modification monomer 501 may have the following structure:

In an embodiment in which the surface energy modification monomer 501 is an acrylic acid monomer, the surface energy modification monomer 501 may have the following structure:

In an embodiment in which the surface energy modification group 502 is a monomer derived from 2-hydroxyethyl acrylate, the surface energy modification monomer 501 may have the following structure:

However, as one of ordinary skill in the art will recognize, the precise structures and examples described to raise the surface energy of the PR polymer resin 500 are intended to be illustrative and are not intended to be limiting. Rather, any suitable functional group within any suitable monomer that would raise the surface energy of the PR polymer resin 500 may alternatively be utilized. These are all fully intended to be included within the scope of the embodiments.

Alternatively, the surface energy modification monomer 501 may be used to decrease the surface energy of the PR polymer resin 500. In such an embodiment, to decrease the surface energy of the PR polymer resin 500, the surface energy modification group 502 within the surface energy modification monomer 501 comprises one or more of an alkyl group, a fluoro group, or a benzyl group. In particular embodiments, the surface energy modification group 502 may comprise a linear, branched, or cyclic alkyl or fluoro functional group.

In a particular embodiment the surface energy modification monomer 501 may have a structure such as the following:

Wherein the $R_2$ and $R_3$ groups collectively form the surface energy modification group 502 and where $R_2$ is an alkyl group with hydrogen attached to the hydrocarbons and wherein $R_2$ may have a straight, branched, or cyclic structure. The alkyl group within $R_2$ may also comprise hetero atoms, such as containing nitrogen or oxygen atoms. However, in this embodiment, $R_3$ may contain at least one of an alkyl, fluoro, or benzyl group, and may comprise a linear, branched, or cyclic alkyl or fluoro group. For example, in some embodiments the PR polymer resin 500 with the surface energy modification monomer 501 may have the following structures:

By utilizing the surface energy modification monomer 501, the surface energy of the PR polymer resin 500 may be modified such that it more closely resembles the surface energy of the filter material 119. By adjusting the surface energy, the PR polymer resin 500 will be better able to fill gaps within the filter material 119. For example, in an embodiment the surface energy of the PR polymer resin 500 may be brought to within about the surface energy around 30~70 dyne/cm of the filter material 119.

In an embodiment the lactone monomer 503 may comprise second lactone groups 504. For example, the second lactone group 504 may be added to the hydrocarbon structure in order to adjust the hydrophilicity of the PR polymer resin 500 and to improve its solubility. In an embodiment the second lactone groups 504 may include rings having five to seven members, although any suitable lactone structure may alternatively be used for the second lactone group 504.

The cross-linking monomer 505 may be used to cross-link the monomer with other polymers within the PR polymer resin 500 to modify the solubility of the PR polymer resin 500, and may optionally have an acid labile group. In a particular embodiment the cross-linking monomer 505 may comprise a hydrocarbon chain that also comprises, e.g., a cross-linking group 506 such as a hydroxyl group, a carboxyl acid group, a carboxylic ester group, epoxy groups, urethane groups, amide groups, glycidil ether groups, alkyl oxide groups, alkene groups, alkyne groups, triazene groups, combinations of these, and the like. Specific examples of cross-linking monomers 505 that may be utilized include polyhydroxystyrene, poly(hydroxynaphthalene), poly(meth-a)crylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth)acrylate, methyl (meth)acrylate, ethyl (meth)acrylate, (meth)acrylic acid, poly(hydroxystyrene-styrene-methacrylate), poly(hydroxystyrene-styrene-methacrylate), poly(4-hydroxystyrene), and poly(pyromellitic dianhydride-ethylene glycol-propylene oxide).

In a particular embodiment, the cross-linking monomer 505 may have the following structure:

Where $R_4$ comprises an alkyl group with hydrogen attached to the hydrocarbon structure, wherein the alkyl group may have a straight, branched, or cyclic structure. Additionally, alkyl group may also comprise a hetero atom, such as comprising a nitrogen atom or an oxygen or fluorine atom, or even an alkyl fluoride.

However, these are not the only cross-linking groups 506 which may be utilized. For example, cross-linking groups such as carboxylic acid, aceto acetyl functional groups, amine groups, acetal functional groups, acrylamide derivative functional groups, or alcohol functional groups, may alternatively be utilized. In a particular embodiment in which the cross-linking groups 506 are an acrylamide derivative, the cross-linking group 506 may have the following structure:

Alternatively, in an embodiment in which the cross-linking groups 506 are an aceto acetyal functional group, the cross-linking groups 506 may have the following structure:

In an embodiment these cross-linking groups 506 may be part of the cross-linking monomer 505 prior to treatment. Alternatively the cross-linking groups 506 may be separately applied to the PR polymer resin in order to cross-link the PR polymer resin.

Additionally, any other suitable cross-linking groups 506, such as the groups described in U.S. Patent Publication No. 2009/0311624 to Horiguchi, et al., entitled "Resist Underlayer Film Forming Composition Containing Liquid Additive," U.S. Patent Publication No. 2007/0207406 to Guerrero, et al., entitled "Anti-Reflective Coatings Using Vinyl Ether Crosslinkers," and the publication "New Thermal Cross-Linkers Based on Triazene: Cross-Linking of Fluorinated Polyimides and Aromatic Polymers," Lau, Aldrich N. K. and Lanchi P. Vo, *Macromolecules* 1992, 25, 7294-7299, which publications are all hereby incorporated herein by reference, may alternatively be used. All such cross-linking groups 506 are fully intended to be included within the scope of the embodiments.

Additionally, as one of ordinary skill in the art will recognize, the above description for the various monomers that may be polymerized to form the PR polymer resin 500 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

In an embodiment the surface energy modification monomer 501 may have a loading within the PR polymer resin 500 of between about 20% and about 60%, such as about 45%. Also, the lactone monomer 503 may have a loading within the PR polymer resin 500 of between about 20% and about 60%, such as about 45% (with a higher loading causing a more polar surface), and the cross-linking monomer 505 may have a loading of between about 1% and about 20%, such as about 10%. However, these descriptions are intended to be illustrative as any suitable loading between the various monomers of the PR polymer resin 500 may be used, and all such loadings are fully intended to be included within the scope of the embodiments.

Returning now to FIG. 2, the seal material 201 may be applied to the filter material 119 (and/or to the other parts of the filter 100) such that the seal material 201 penetrates the pores 115 and the filter material 119. In an embodiment the seal material 201 may be applied to the filter material 119 by introducing the seal material 201 into the filter basin 101 while the filter material 119 is within the filter basin 101. Once the filter material 119 has been wetted by the seal material 201, excess seal material 201 may be removed from the filter basin 101, leaving behind the now wetted filter material 119 within the filter membrane 105.

Figure 6A:
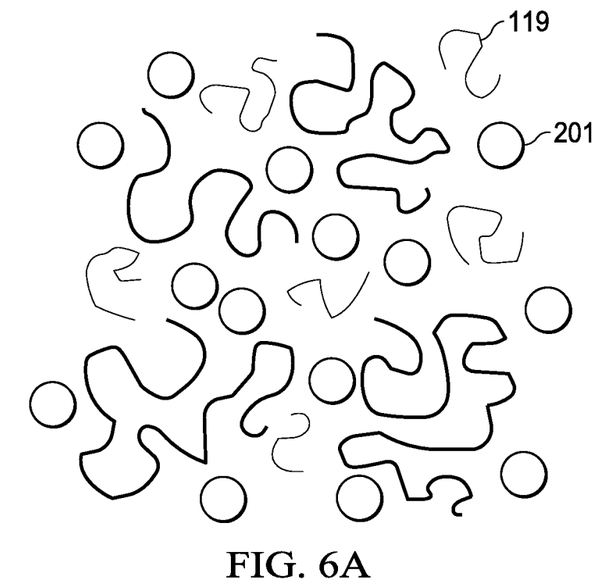
FIGS. 6A-6B illustrate an embodiment of a floating cross-linking seal material in accordance with some embodiments.
Figure 6B:
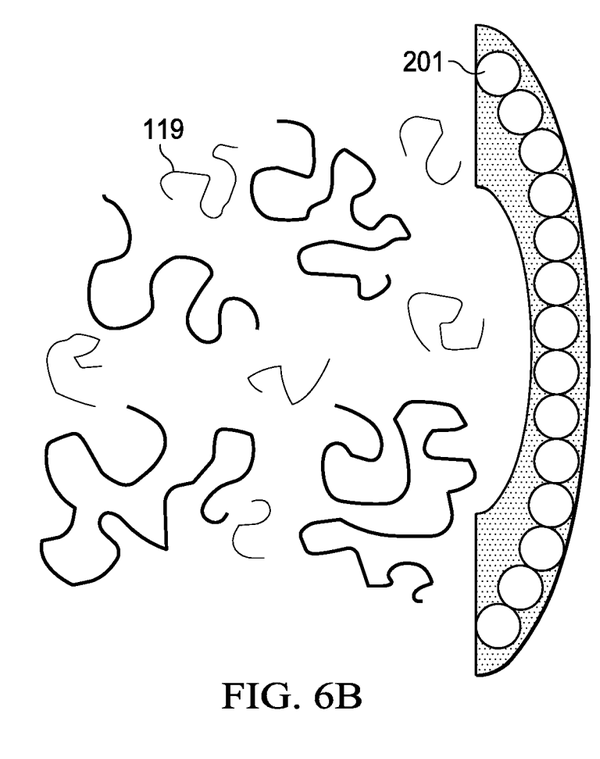

FIGS. 6A-6B illustrate that, in an embodiment in which the seal material 201 comprises the floating cross-linking group, a period of time may be waited after the filter material 119 has been wetted before the treatment 701 is applied. Looking first at FIG. 6A, FIG. 6A illustrates an initial application of the seal material 201 such that the seal material 201 penetrates the filter material 119. FIG. 6B illustrates that, in this embodiment a time period of between about 1 second and about 1 hour, such as about 1 minute, may be waited after the seal material 201 has been applied, in which time the seal material 201, caused by the difference in surface tension, will "float" to a surface of the filter material 119, such that the treatment 701, once applied, will cause the seal material 201 to form the seal 703 (not separately illustrated in FIG. 6B) on the surface of the filter material 119.

Figure 7:
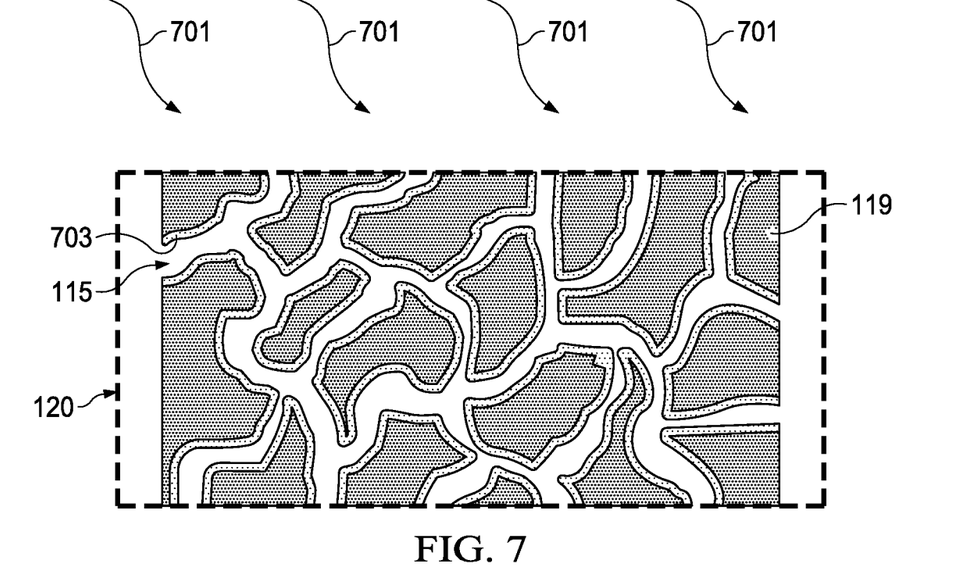
FIG. 7 illustrates a treatment applied to the seal material to form a seal in accordance with some embodiments.

FIG. 7 illustrates that, once the seal material 201 has been placed on the filter material 119, the seal material 201 is subjected to a treatment (represented in FIG. 7 by the wavy lines labeled 701) to initiate a cross-linking reaction between the various molecules and polymers so that the molecules and polymers will cross-link and form a barrier between the filter material 119 and, e.g, the process liquid 102. In an embodiment the treatment 701 may be either a physical treatment or a chemical treatment, although any other suitable treatment that will initiate a cross-linking reaction may alternatively be utilized. For example, in an embodiment in which the seal material 201 is subject to a physical treatment, the treatment 701 may be an UV treatment. In such an embodiment ultraviolet radiation is directed towards the seal material 201 (already located on the filter material 119). When the ultraviolet radiation impinges upon the seal material 201, the ultraviolet radiation will initiate a chemical reaction within, e.g., the cross-linking groups 303 within the seal material 201, and the cross-linking groups will crosslink with each other, thereby bonding one of the polymers located on the filter material 119 with another one of the polymers on the filter material 119 and forming the seal 703, thereby sealing the filter membrane 105 within the seal material 201.

However, the ultraviolet radiation treatment described above is only intended to be illustrative and is not intended to be limiting. Rather, any suitable physical treatment, such as a plasma exposure, an ion implantation, a gamma radiation exposure, an e-beam process, or increasing the pressure, may be utilized to initiate the cross-linking. All such physical treatments that will initiate the cross-linking reaction are fully intended to be included within the scope of the embodiments.

Alternatively, the seal material 201 may be subjected to a chemical treatment to initiate the cross-linking reaction. In an embodiment the seal material 201 may be treated by contacting the seal material 201 with a free radical generator such as $O_3/H_2O$ or $H_2O_2$. Such a free radical generator will also initiate the chemical reaction within the seal material 201 to cause the seal material 201 to cross-link and seal the filter material 119 within the filter membrane 105. In such an embodiment the seal material 201 is either exposed to or immersed in a solution of the free radical generator, whereby the contact initiates the cross-linking reaction.

However, the free radical generators described above are intended to be illustrative only and are not intended to be limiting. Rather, any suitable reactant that will initiate the cross-linking reaction may be used. All such initiators are fully intended to be included within the scope of the embodiments.

Figure 8:
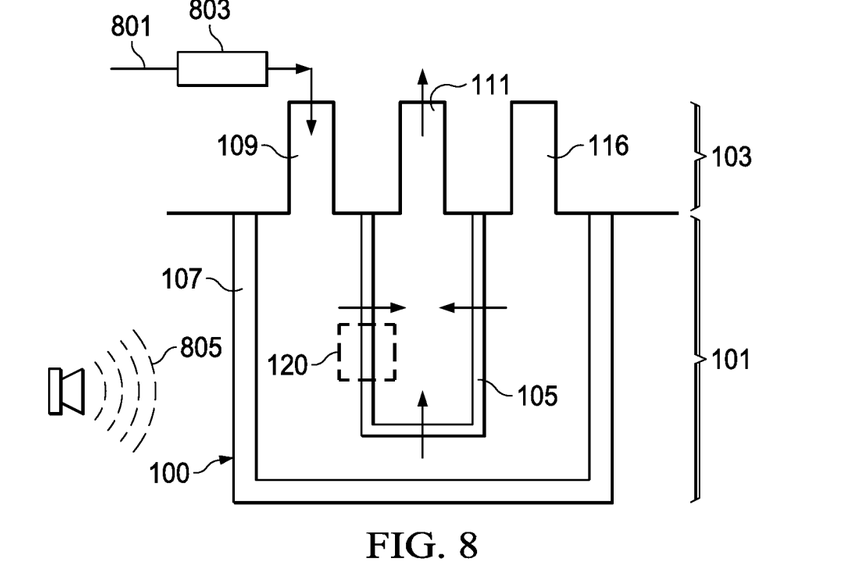
FIG. 8 illustrates a cleaning of the seal in accordance with some embodiments.

FIG. 8 illustrates that, once the cross-linking reaction has been performed and the seal 703 has been created, excess seal material 201 may be removed using, e.g, one or more cleaning processes. In an embodiment the cleaning process may be performed within the filter basin 101, although the cleaning processes may also be performed outside of the filter basin 101, such as by being performed in a separate cleaning unit, if so desired.

In an embodiment the cleaning process may comprise the introduction of a cleaning solution 801 to remove the excess seal material 201 from the filter material 119 within the filter membrane 105. In an embodiment the cleaning solution 801 may comprise a heated solvent. Increasing the temperature of the solvent for cleaning the filter membrane 105 and housing 107 can improve dissolving performance. In accordance with some embodiments, the temperature of the cleaning solution 801 is increased to higher than about 23° C., and possibly between about 15° C. and 90° C. (depending on the type of solvent used), during the cleaning of the filter membrane 105 and housing 107. The heating of the cleaning solution 801 may be achieved using a heater element 803, with, e.g., a resistive type of heater, wherein the cleaning solution 801 is heated when passing through the heater element 803.

In an embodiment the cleaning solution 801 may comprise one or more sequentially introduced solvents. For example, in one embodiment, the cleaning solution 801 may comprise four sequentially applied materials, including a first solvent with a low surface tension, a first reactant, a second solvent, and a rinse. In an embodiment the first solvent may have a low surface tension of around 20 dyne/cm, and may be selected from, but not limited to, alkanes, ethers, esters, ketones, amines, and alcohols. For example, the first solvent may include octane, Propylene Glycol Monomethyl Ether Acetate (PGMEA), and Propylene Glycol Monomethyl Ether (PGME).

Additionally, the first solvent may, or may not, include a surfactant therein. The surfactant may be an ionic or a non-ionic type surfactant. For example, the non-ionic surfactant may include octaethylene glycol monododecyl ether, and/or pentaethylene glycol monododecyl ether. The ionic surfactant may include, and is not limited to, perfluorooctanesulfonate, perfluorononanoate, and perfluorooctanoate.

Alternatively, the first solvent may be a non-polar solvent, and may be selected from, but not limited to, alkanes, aromatics, ethers, and alkyl halides. For example, the non-polar solvents may include pentane, octane, hexane, cyclohexane, isooctane, trimethylpentane, heptane, toluene, xylene, benzene, and/or the like.

Alternatively, the first solvent may be a polar solvent, and may be selected from, and but not limited to, esters, aldehydes, ketones, and amines. For example, the polar solvents may include propyl ether, ethyl ether, butyl acetate, ethyl acetate, methyl ethyl ketone, acetone, aniline, cyclohexanone, and the like.

The reactant may be a reactant that can remove impurities such as uncross-linked seal material 201. In an embodiment the reactant may be a chemical such as HF, $HNO_3$, $CH_3COOH$, $NH_4OH$, HCL, or $H_2O_2$. However, any suitable reactant may be utilized to help remove the excess seal material 201.

The rinse may be an aqueous solution and may be selected from alcohols, amides, carboxylic acids, and/or water. For example, the aqueous solution may comprise de-ionized (DI) water, ethylene glycol, methanol, dimethyl formamide, isopropyl alcohol, ethanol, propanol, isobutyl alcohol, butanol, ammonium hydroxide, and/or the like.

In some other exemplary embodiments, the cleaning is performed using hexane, followed by acetone, then finished by DI water. Hexane, which has a non-polar property, helps to dissolve non-polar impurities, and its low surface tension help prime porous membrane, which is beneficial for the subsequent liquid flushing procedure. Acetone, which has a carbonyl group, has strong polar properties. Therefore, acetone helps attract polar impurities. The DI water has a rich hydrogen bonding property, which is good for dissolving impurities with hydrogen bonding acceptors. In these embodiments, the solvent amount may be in the range from about 10 times to about 200 times the volume of filter basin 101.

Additionally, a megasonic cleaning process may also be utilized. In such an embodiment a megasonic sound wave 805 may be applied to the cleaning solution 801 within the filter basin 101. The application of a megasonic sound wave 805 increases the possibility of collisions between the molecules of the cleaning solution 801 and the excess seal material 201. For example, the megasonic sound wave 805 may be applied with a power of between about 10 W and about 1000 W for a time period of between about 0.1 seconds to about 1 minute.

Finally, once the cleaning solution 801 has been used, the cleaning solution 801 may be removed and the filter basin 101 (or other system used to clean the filter material 119) may be purged. In an embodiment the purge may be performed using clean dry air (CDA), air, nitrogen ($N_2$), argon, combinations of these, or the like. However, any suitable purge gas may alternatively be utilized.

Figure 9:
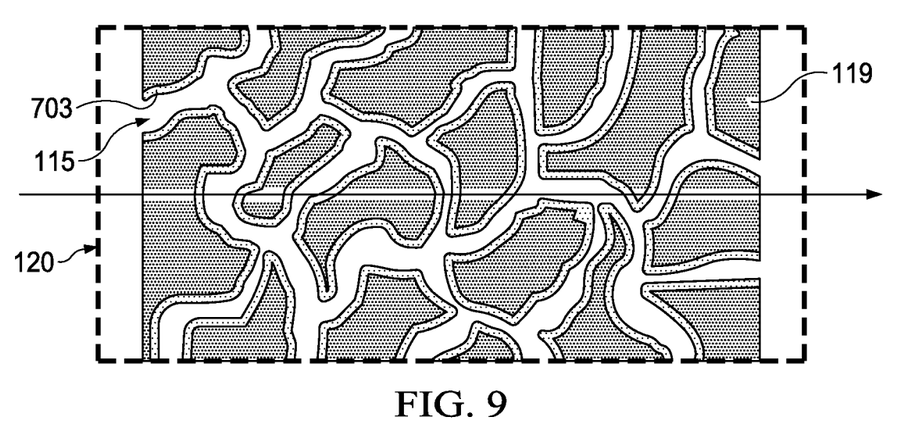
FIG. 9 illustrates a usage of the filter to filter a process liquid in accordance with some embodiments.

FIG. 9 illustrates that, once the filter material 119 within the filter membrane 105 has been sealed with the seal 703, the filter membrane 105 may be replaced within the filter basin 101 (if removed for, e.g., the treatment 701 or cleaning) and may be used to filter the process liquid 102, such as a negative tone developer used to develop a photoresist into a negative tone pattern, although any suitable process liquid 102 may be alternatively be utilized. In an embodiment the process liquid 102 may be introduced to the pores 115 within the filter material 119, which will filter impurities out of the process liquid 102 depending upon the size of the pores 115. However, because the seal 703 is in place and separating the filter material 119 from the process liquid 102, the process liquid 102 is unable to leach portions of the filter material 119 from the filter membrane 105. As such, impurities caused by such a leaching may be reduced or eliminated.

Figure 10:
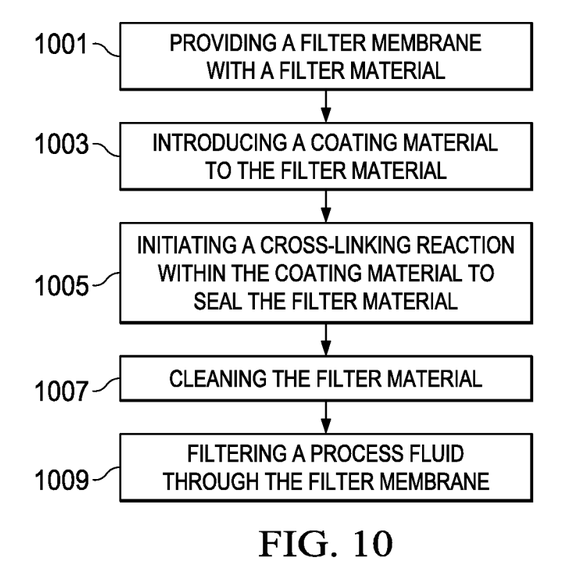
FIG. 10 illustrates a flow chart of a process for treating a filter in accordance with some embodiments.

FIG. 10 illustrates a flow chart of a process for treating a filter in accordance with some embodiments. In this process, a filter membrane with a filter material is provided in a first step 1001, and a coating material is introduced to the filter material in a second step 1003. A cross-linking reaction is initiated within the coating material to seal the filter material in a third step 1005. The filter material is cleaned in a fourth step 1007, and a process fluid is filtered through the filter membrane in a fifth step 1009.

In accordance with an embodiment, a filter comprising a filter basin and a filter membrane comprising a filter material is provided. A seal seals the filter material, wherein the seal modifies a surface tension of the filter membrane to between about 30 dynes/cm and about 70 dynes/cm.

In accordance with another embodiment, a method of sealing a filter comprising providing a filter membrane with a filter material and introducing a coating material to the filter material is provided. A cross-linking reaction is initiated within the coating material to seal the filter material.

In accordance with yet another embodiment, a method of using a filter comprising sealing a filter membrane prior to passing process liquid through the filter membrane is provided. The sealing the filter membrane further comprises contacting a sealing material with the filter membrane and initiating a cross-linking reaction to seal the filter material within the sealing material. A process liquid is filtered through the filter membrane, wherein the process liquid is separated from the filter membrane by the sealing material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a filter material, the filter material comprising polyethylene;
   introducing a coating material to the filter material, wherein the coating material comprises a polymer having a cross-linking group, a surface energy modification group, and a lactone group, the cross-linking group comprising a hydroxyl group, the lactone group comprising a ring having five to seven members, the surface energy modification group comprising one of the following:

performing a physical treatment to seal the filter material.

2. The method of claim 1, wherein the coating material floats to a surface of the filter material prior to the performing the physical treatment to seal the filter material.

3. The method of claim 1, wherein the physical treatment is performed at least in part with an e-beam exposure.

4. The method of claim 1, wherein the physical treatment is performed at least in part with a plasma exposure.

5. The method of claim 1, wherein the physical treatment is performed at least in part with radiation exposure.

6. The method of claim 1, further comprising, after the performing the physical treatment to seal the filter material, removing excess coating material from the filter material.

7. The method of claim 1, wherein the polymer further comprises a fluorine-containing group.

8. The method of claim 1, wherein the physical treatment is performed at least in part with an ion implantation.

9. The method of claim 1, wherein the physical treatment is performed at least in part with a gamma radiation exposure.

10. A method comprising:
    sealing a filter membrane prior to passing a process liquid through the filter membrane, the filter membrane comprising polyethylene, wherein the sealing the filter membrane further comprises:
    contacting a sealing material with the filter membrane, wherein the sealing material comprises a photoresist polymer resin having a lactone group, a cross-linking group, and a surface energy modification group, the lactone group comprising a cyclic organic compound having between 5 and 7 ring carbons, the cross-linking group comprising a hydroxyl group, the surface energy modification group comprising one or more of:

performing a physical treatment to seal the filter membrane within the sealing material; and filtering the process liquid through the filter membrane, wherein the process liquid is separated from the filter membrane by the sealing material.

11. The method of claim 10, wherein the sealing the filter membrane comprises modifying a surface tension of the filter membrane to between 30 dynes/cm and 70 dynes/cm.

12. The method of claim 10, wherein the physical treatment is performed at least in part by increasing pressure.

13. The method of claim 10, wherein the physical treatment is performed at least in part with an ultraviolet radiation exposure.

14. The method of claim 10, wherein the physical treatment is performed at least in part with a gamma radiation exposure.

15. The method of claim 10, wherein the physical treatment is performed at least in part with an e-beam exposure.

16. A method comprising:
introducing a seal material to a filter material, the filter material comprising polyethylene, wherein the seal material coats surfaces of the filter material, wherein the seal material comprises a polymer resin having a surface energy modification group, a cross-linking group, and a lactone group, the cross-linking group comprising a hydroxyl group, the lactone group comprising a ring having five to seven members, the surface energy modification group comprising one of the following:

treating the seal material on the surfaces of the filter material with a chemical treatment to form a seal around the filter material;

after treating the seal material, removing excess seal material from the filter material; and filtering a process liquid through the filter material, wherein the process liquid is separated from the filter material by the treated seal material.

17. The method of claim 16, wherein the removing the excess seal material from the filter material comprises introducing a heated solvent into the filter material.

18. The method of claim 16, wherein the process liquid comprises a negative tone developer.

19. The method of claim 16, further comprising waiting a period of time after the introducing the seal material before the treating the seal material, wherein at least a portion of the seal material floats to a top surface of the filter material during the period of time, and wherein the period of time is 1 minute.

20. The method of claim 16, wherein the chemical treatment is performed at least in part by contacting the seal material with a free radical generator.

* * * * *

UNITED STATES PATENT AND TRADEMARK OFFICE
CERTIFICATE OF CORRECTION

PATENT NO. : 11,351,509 B2
APPLICATION NO. : 14/338883
DATED : June 7, 2022
INVENTOR(S) : Lo et al.

Page 1 of 1

It is certified that error appears in the above-identified patent and that said Letters Patent is hereby corrected as shown below:

In the Claims

Claim 1, Column 16, Lines 20-29;

Delete " 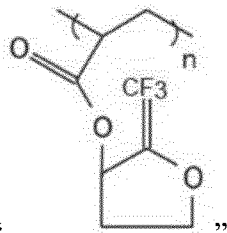 "

And insert -- 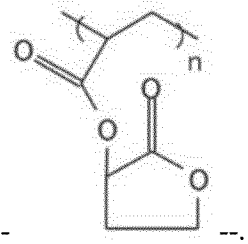 --.

Signed and Sealed this
Second Day of August, 2022

Katherine Kelly Vidal
*Director of the United States Patent and Trademark Office*